United States Patent
Du

(10) Patent No.: US 9,076,953 B2
(45) Date of Patent: Jul. 7, 2015

(54) SPIN TRANSISTORS EMPLOYING A PIEZOELECTRIC LAYER AND RELATED MEMORY, MEMORY SYSTEMS, AND METHODS

(71) Applicant: QUALCOMM Incorporated, San Diego, CA (US)

(72) Inventor: Yang Du, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 189 days.

(21) Appl. No.: 13/746,011

(22) Filed: Jan. 21, 2013

(65) Prior Publication Data

US 2013/0299880 A1    Nov. 14, 2013

Related U.S. Application Data

(60) Provisional application No. 61/644,592, filed on May 9, 2012.

(51) Int. Cl.

| | | |
|---|---|---|
| *H01L 29/66* | (2006.01) | |
| *H01L 29/84* | (2006.01) | |
| *H01L 21/76* | (2006.01) | |
| *G11C 11/00* | (2006.01) | |
| *G11C 11/14* | (2006.01) | |
| *H01L 43/02* | (2006.01) | |
| *H01L 27/22* | (2006.01) | |
| *H01L 43/12* | (2006.01) | |
| *H01L 43/08* | (2006.01) | |

(52) U.S. Cl.
CPC .............. *H01L 43/02* (2013.01); *H01L 27/228* (2013.01); *H01L 43/12* (2013.01); *H01L 29/66984* (2013.01); *H01L 43/08* (2013.01)

(58) Field of Classification Search
CPC ... H01L 43/02; H01L 43/08; H01L 29/66984; H01L 27/228
USPC .......... 257/421, 252, 254, E21.655, E27.005, 257/E29.323, E27.006; 438/3; 365/158, 365/171, 157
See application file for complete search history.

(56) References Cited

U.S. PATENT DOCUMENTS

| | | |
|---|---|---|
| 6,829,157 B2 | 12/2004 | Kim et al. |
| 7,282,755 B2 | 10/2007 | Pakala et al. |
| 7,283,386 B2 | 10/2007 | Shin et al. |

(Continued)

OTHER PUBLICATIONS

International Search Report and Written Opinion—PCT/US2013/040406 International Search Authority—European Patent Office, Jan. 2, 2014.

(Continued)

*Primary Examiner* — Fernando L. Toledo
*Assistant Examiner* — Aaron Gray
(74) *Attorney, Agent, or Firm* — Nicholas J. Pauley; Peter Michael Kamarchik; Paul Holdaway

(57) ABSTRACT

Spin transistors and related memory, memory systems, and methods are disclosed. A spin transistor is provided by at least two magnetic tunnel junctions (MTJs) with a shared multiferroic layer. The multiferroic layer is formed from a piezoelectric (PE) thin film over a ferromagnetic thin film (FM channel) with a metal electrode (metal). The ferromagnetic layer functions as the spin channel and the piezoelectric layer is used for transferring piezoelectric stress to control the spin state of the channel. The MTJ on one side of the shared layer forms a source and the MTJ on the other side is a drain for the spin transistor.

14 Claims, 8 Drawing Sheets

(56) References Cited

U.S. PATENT DOCUMENTS

| | | |
|---|---|---|
| 7,982,249 B2 | 7/2011 | Worledge |
| 2006/0133137 A1 | 6/2006 | Shin et al. |
| 2010/0032738 A1* | 2/2010 | Zhu .............................. 257/295 |
| 2010/0080048 A1 | 4/2010 | Liu et al. |
| 2010/0258849 A1* | 10/2010 | Worledge ...................... 257/295 |

OTHER PUBLICATIONS

Kim S-K., et al., "Voltage control of a magnetization easy axis in piezoelectric/ferromagnetic hybrid films", Journal of Magnetism and Magnetic Materials, Elsevier Science Publishers, Amsterdam, NL, vol. 267, No. 1, Nov. 1, 2003, pp. 127-132, XP004468123, ISSN: 0304-8853, DOI: 10.1016/S0304-8853 (03)00297-X paragraph [0002]; figures 1a-1c.

* cited by examiner

US 9,076,953 B2

SPIN TRANSISTORS EMPLOYING A PIEZOELECTRIC LAYER AND RELATED MEMORY, MEMORY SYSTEMS, AND METHODS

PRIORITY CLAIM

The present application claims priority to and the benefit of U.S. Patent Application Ser. No. 61/644,592 filed on 9 May 2012 and entitled "SPIN TRANSISTORS AND RELATED MEMORY, MEMORY SYSTEMS, AND METHODS," which is incorporated herein by reference in its entirety.

BACKGROUND

I. Field of the Disclosure

The technology of the disclosure relates generally to magnetic tunnel junctions (MTJs) used to provide memory cells.

II. Background

The electronics industry commonly uses switches as a component of circuit design. To date, these switches have been charge based switches, such as a CMOS or MOSFET switch. Power consumption in such charge based switches remains a concern and there remains continued pressure to find low power alternatives to existing switching technology.

Magnetic tunnel junctions (MTJs) can be used as switches, but are more frequently used in memory applications, such as magnetic random access memory (MRAM), which is non-volatile memory in which data is stored by programming an MTJ. However, conventional MTJs consume certain amounts of power in switching between states. In many devices, such as portable electronics, there is a general goal to reduce power consumption by such memory elements.

Despite the power consumption of an MTJ, MRAM is advantageous because the MTJ can be used to store information even when power is turned off. Data is stored in the MTJ as a small magnetic element, rather than an electric charge or current. An exemplary MTJ 10 is illustrated in FIG. 1. Data is stored in the MTJ 10 according to the magnetic orientation between two layers: a free layer 12 disposed above a fixed or pinned layer 14. The free and pinned layers 12, 14 are formed from a ferromagnetic material. The MTJ 10 is configured in a conventional "bottom-spin valve" configuration wherein the pinned layer 14 is disposed below the free layer 12. The free and pinned layers 12, 14 are separated by a tunnel junction or barrier 16 formed by a thin non-magnetic dielectric layer. The free and pinned layers 12, 14 can store information even when the magnetic H-field is '0' due to the hysteresis loop 18 of the MTJ 10. Electrons can tunnel through the tunnel barrier 16 if a bias voltage is applied between two electrodes 20, 22 coupled on ends of the MTJ 10. The tunneling current depends on the relative orientation of the free and pinned layers 12, 14. When using a spin-torque-transfer (STT) MTJ, the difference in the tunneling current as the spin alignment of the free and pinned layers 12, 14 is switched between parallel (P) and anti-parallel (AP) is known as the tunnel magnetoresistance ratio (TMR).

When the magnetic orientations of the free and pinned layers 12, 14 are anti-parallel to each other (shown in FIG. 1 as MTJ 10'), a first memory state exists (e.g., a logical '1'). When the magnetic orientations of the free and pinned layers 12, 14 are parallel to each other (shown in FIG. 1 as MTJ 10"), a second memory state exists (e.g., a logical '0'). The magnetic orientation of the free and pinned layers 12, 14 can be sensed to read data stored in the MTJ 10 by sensing the resistance when current flows through the MTJ 10. Data can also be written and stored in the MTJ 10 by applying a magnetic field to change the orientation of a free ferromagnetic layer 12 to either a P or AP magnetic orientation with respect to the pinned layer 14. The magnetic orientation of the free layer 12 can be changed, but the magnetic orientation of the pinned layer 14 is fixed.

FIG. 2 illustrates an STT MU 23 (referred to as "MTJ 23") of similar design to the MTJ 10 in FIG. 1. The MTJ 23 is provided as part of an MRAM bitcell 24 to store non-volatile data. The MRAM bitcell 24 may be provided in a memory array and used as memory storage for any type of system requiring electronic memory, such as a computer processing unit (CPU) or processor-based system, as examples. A metal-oxide semiconductor (typically n-type MOS, i.e., NMOS) access transistor 26 is provided to control reading and writing to the MTJ 23. The drain (D) of the access transistor 26 is coupled to the bottom electrode 22 of the MTJ 23, coupled to the pinned layer 14. A word line ($V_{WL}$) is coupled to the gate (G) of the access transistor 26. The source (S) of the access transistor 26 is coupled to a voltage source ($V_S$). A bit line ($V_{BL}$) is coupled to the top electrode 20 of the MTJ 23, which is coupled to the free layer 12.

When reading data stored in the MTJ 23, the word line ($V_{WL}$) is activated for the access transistor 26 to allow a small current to flow through the MTJ 23 between the electrodes 20, 22. A low resistance, as measured by voltage applied on the bit line ($V_{BL}$) divided by the measured current, is associated with a P orientation between the free and pinned layers 12, 14. A higher resistance is associated with an AP orientation between the free and pinned layers 12, 14. When writing data to the MTJ 23, the gate (G) of the access transistor 26 is activated by activating the word line ($V_{WL}$). A voltage differential between the bit line ($V_{BL}$) and the source line ($V_S$) is applied. As a result, a write current (I) is generated between the drain (D) and the source (S). If the magnetic orientation is to be changed from AP to P, a write current ($I_{AP-P}$) flowing from the top electrode 20 to the bottom electrode 22 is generated, which induces a STT at the free layer 12 to change the magnetic orientation of the free layer 12 to P with respect to the pinned layer 14. If the magnetic orientation is to be changed from P to AP, a current ($I_{P-AP}$) flowing from the bottom electrode 22 to the top electrode 20 is produced, which induces an STT at the free layer 12 to change the magnetic orientation of the free layer 12 to AP with respect to the pinned layer 14.

Regardless of whether the device is provided as a switch or a read/write memory device or to what state the device is changing, a certain amount of current (i.e., power) is required. Power consumption shortens battery life in mobile terminals such as mobile phones and generates waste heat which must be dissipated in all devices. Thus, as noted above, there is a generally desired goal to reduce power consumption in processor based systems that may employ MRAM.

SUMMARY OF THE DISCLOSURE

Embodiments disclosed in the detailed description include spin transistors and related memory, memory systems, and methods. A spin transistor is provided by at least two magnetic tunnel junctions (MTJs) with a shared multiferroic layer. In one embodiment, the multiferroic layer is formed from a piezoelectric (PE) thin film over a ferromagnetic thin film (FM channel) with a metal electrode (metal). The ferromagnetic layer functions as the spin channel and the piezoelectric layer is used for transferring piezoelectric stress to control the spin state of the channel. The MTJ on one side of the shared layer forms a source and the MTJ on the other side is a drain for the spin transistor. When a voltage pulse is provided to the PE film, the PE film induces stress against the ferromagnetic layer. The induced stress-anisotropy in the ferromagnetic layer in turn leads to a ninety degree rotation of the favorable spin orientation (easy axis) from an initially Parallel or Anti-parallel state. This rotation sets up a meta-stable spin state. When a small voltage between a source and drain of the spin transistor is applied, a small spin polarized current collapses the spin state to a parallel orientation and turns the channel to a low impedance state, completing the spin transistor on-state transition. When there is no voltage between the source and drain, the magnetic dipole forces the spin state to Anti-parallel and changes the channel to a high impedance state, completing the off-state transition.

In this regard, in one embodiment, a voltage controlled spin channel comprises a first electrode, a ferromagnetic layer configured to provide a channel region and a piezoelectric dielectric layer disposed between the first electrode and the ferromagnetic layer configured to provide a gate dielectric.

In another embodiment, a spin transistor is provided. The spin transistor comprises a first MTJ comprising a first ferromagnetic layer and a first channel, a second MTJ comprising a second ferromagnetic layer and a second channel, and a shared spin layer. The shared spin layer comprises an electrode, a piezoelectric layer, and a ferromagnetic spin layer. The first MTJ forms a source for the spin transistor, the second MTJ forms a drain for the spin transistor and the electrode forms a gate for the spin transistor.

In another embodiment, a method for forming a spin transistor is provided. The method comprises providing a first electrode and providing a ferromagnetic layer configured to provide a channel region. The method further comprises disposing a piezoelectric dielectric layer between the first electrode and the ferromagnetic layer to provide a gate dielectric.

In another embodiment, a method for forming a spin transistor is provided. The method comprises providing a first MTJ comprising a first ferromagnetic layer and a first channel. The method further comprises providing a second MTJ comprising a second ferromagnetic layer and a second channel. The method further comprises providing a shared spin layer comprising an electrode, a piezoelectric dielectric layer, and a ferromagnetic spin layer, wherein the first MTJ forms a source for the spin transistor, the second MTJ forms a drain for the spin transistor and the electrode forms a gate for the spin transistor.

In another embodiment, a spin valve switch comprises a first electrode, a ferromagnetic layer configured to provide a channel region, a piezoelectric dielectric layer disposed between the first electrode and the ferromagnetic layer configured to provide a gate dielectric, a first fixed ferromagnetic layer forming a first magnetic junction or first spin valve with the ferromagnetic layer, and a second fixed ferromagnetic layer forming a second magnetic junction or second spin valve with the ferromagnetic layer.

DETAILED DESCRIPTION

Figure 1:
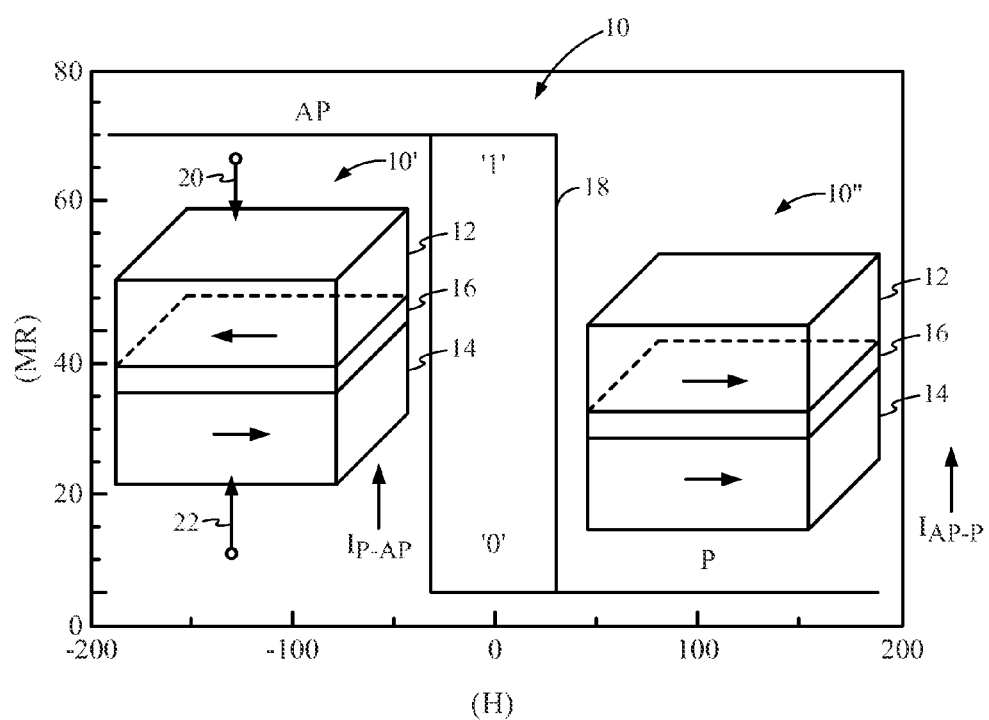
FIG. 1 is an illustration of a magnetic tunnel junction in the prior art show in both parallel (P) and anti-parallel (AP) states.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include spin transistors and related memory, memory systems, and methods. A spin transistor is provided by at least two magnetic tunnel junctions (MTJs) with a shared multiferroic layer. In one embodiment, the multiferroic layer is formed from a piezoelectric (PE) thin film over a ferromagnetic thin film (FM channel) with a metal electrode (metal). The ferromagnetic layer functions as the spin channel and the piezoelectric layer is used for transferring piezoelectric stress to control the spin state of the channel. The MTJ on one side of the shared layer forms a source and the MTJ on the other side is a drain for the spin transistor. When a voltage pulse is provided to the PE film, the PE film induces stress against the ferromagnetic layer. The induced stress-anisotropy in the ferromagnetic layer in turn leads to a ninety degree rotation of the favorable spin orientation (easy axis) from an initially Parallel or Anti-parallel state. This rotation sets up a meta-stable spin state. When a small voltage between a source and drain of the spin transistor is applied, a small spin polarized current collapses the spin state to a parallel orientation and turns the channel to a low impedance state, completing the spin transistor on-state transition. When there is no voltage between the source and drain, the magnetic dipole forces the spin state to Anti-parallel and changes the channel to a high impedance state, completing the off-state transition.

Figure 3:
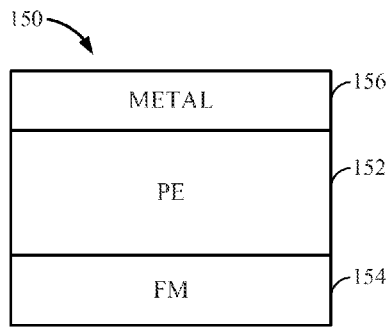
FIG. 3 is a simplified block diagram of an exemplary embodiment of a voltage controlled spin channel according to the present disclosure.

In this regard, FIG. 3 is a simplified diagram of a voltage controlled spin channel 150. The voltage controlled spin channel 150 may form the building block of a spin transistor as described in greater detail below. The voltage controlled spin channel 150 includes a piezoelectric dielectric layer 152. On one side of the piezoelectric dielectric layer 152 is a ferromagnetic layer 154 and on the other side of the piezoelectric dielectric layer 152 is a metal layer 156. The metal layer 156 provides a first electrode for the voltage controlled spin channel 150 and the ferromagnetic layer 154 provides a channel region for the voltage controlled spin channel 150. The piezoelectric dielectric layer 152 acts as a gate dielectric. Collectively, the piezoelectric dielectric layer 152 and the ferromagnetic layer 154 are sometimes referred to herein as a multiferroic stack.

The voltage controlled spin channel 150 has an energy state for the ferromagnetic layer 154, and that energy state is defined herein to be $E_{total}$. The most stable state for the voltage controlled spin channel 150 is the lowest energy state. $E_{total}$ is equal to the sum of the physical properties of the magnetic elements, the energy formed by any magnetic dipole and any external forces. Thus, $E_{total}$ may be defined mathematically as follows:

$$E_{total}=E_0+E_{dipole}+E_{spin-torque}+E_{stress-anisotropy}$$

Where $E_0$ is a function of the physical properties and geometries of the magnetic elements; $E_{dipole}$ is a function of a magnetic dipole, $E_{spin-torque}$ is a function of spin-spin interaction or spin-torque, and $E_{stress-anisotropy}$ is a function of the external mechanical forces. Typically, the $E_{dipole}$ is small. Absent any $E_{stress-anisotropy}$ and $E_{spin-torque}$, the lowest energy state is anti-parallel in a spin transistor, primarily because of $E_{dipole}$. Thus, if the voltage controlled spin channel 150 is incorporated into a spin transistor, the default orientation for the ferromagnetic layer 154 is anti-parallel (i.e., it wants to be the opposite of the fixed ferromagnetic layers which are used to form the source and the drain of the spin transistor (shown in greater detail below)). However, when energy is supplied to the ferromagnetic layer 154 in the form of a stress from the piezoelectric dielectric layer 152 by applying a small voltage pulse to the metal electrode 15, $E_{total}$ changes and seeks a new lowest energy state. In such a case, the lowest energy state is a meta-stable spin state, which prefers the spin state normal to the easy axis. Now, when a small voltage is applied (e.g., a current flows from a source to a drain in a spin transistor), a small spin polarized current collapses the spin state to a parallel orientation and turns the channel to a low impedance state. Another pulse of voltage pushes the orientation back to anti-parallel when there is no spin polarized current between source and drain.

Figure 4A:
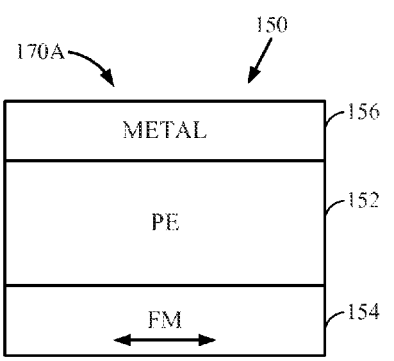
FIGS. 4A-4C illustrate three states of the spin transistor of FIG. 3.
Figure 4B:
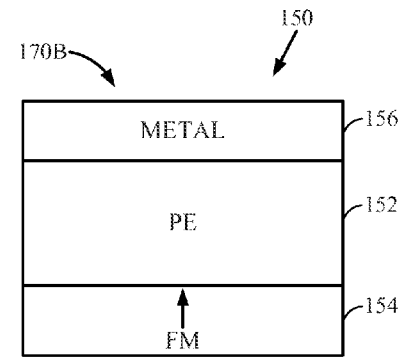
Figure 4C:
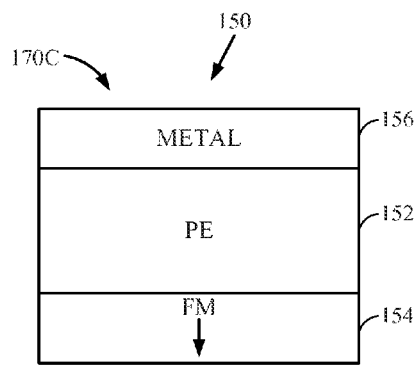

The states of the ferromagnetic layer 154 are illustrated in FIGS. 4A-4C (and discussed in more detail below) namely a strain induced metastable spin state transition 170A (FIG. 4A), a spin current set ON state (i.e., parallel) 170B (FIG. 4B), and a dipole induced OFF state (i.e., anti-parallel) 170C (FIG. 4C) and can switch between them according to the existence of a voltage at the metal layer 156 and a spin current between source and drain.

Figure 2:
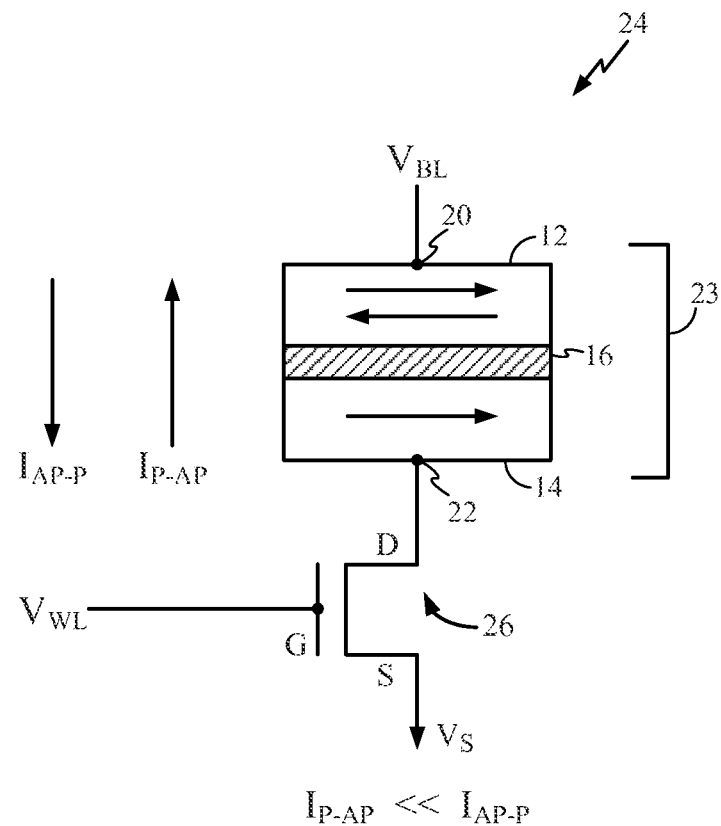
FIG. 2 is a diagram of an exemplary magnetic random access memory (MRAM) bitcell employing a conventional magnetic tunnel junction (MTJ) design in the prior art.

With continuing reference to FIGS. 3 and 4A-4C, when a voltage is applied to the first electrode (i.e., the metal layer 156 of the voltage controlled spin channel 150), the voltage causes the piezoelectric dielectric layer 152 to change shape, which causes a physical strain in the ferromagnetic layer 154. A relatively low voltage is required to impart this strain (e.g., <0.1 V for a thin multiferroic stack). The strain on the ferromagnetic layer 154 coupled with the voltage allows the state of the ferromagnetic layer 154 to be changed. Under stress, the ferromagnetic layer 154 will fall into the metastable spin state. The metastable spin state is a state where the ferromagnetic layer 154 is under a strain and the spin orientation lying horizontally. Once stress is released, the spin state will fall back to the easy axis (vertical) along AP or P direction, determined by whether a spin polarized current is flowing through the channel, i.e., parallel with a small spin polarized current, anti-parallel with no spin polarized current. Therefore, addition of the physical strain means that the amount of current required to effectuate the change to a parallel spin orientation is much lower than that required to change states in the MTJ 23 of FIG. 2. Thus, the spin current of the voltage controlled spin channel 150 is relatively small and can be conducted at a very low biasing voltage, such as, for example, 0.1V. Similar to CMOS logic, the switch delay depends on CV/I, and switching energy follows $CV^2$, but with a low C (>100 A piezoelectric layer thickness) and very low $V^2$. Also, the channel state is locked and therefore, no power needs be provided except during switching phases.

The conductance of the voltage controlled spin channel 150 is controlled by the spin polarization of the ferromagnetic layer 154, which is manipulated by the voltage applied to the metal layer 156 by the strain and thus induced strain in the piezoelectric layer 152.

In an exemplary embodiment, the piezoelectric layer 152 may be lead zirconate titanate (PZT) and the metal layer 156 may be any conductor such as copper, silver, or aluminum or the like.

Figure 5A:
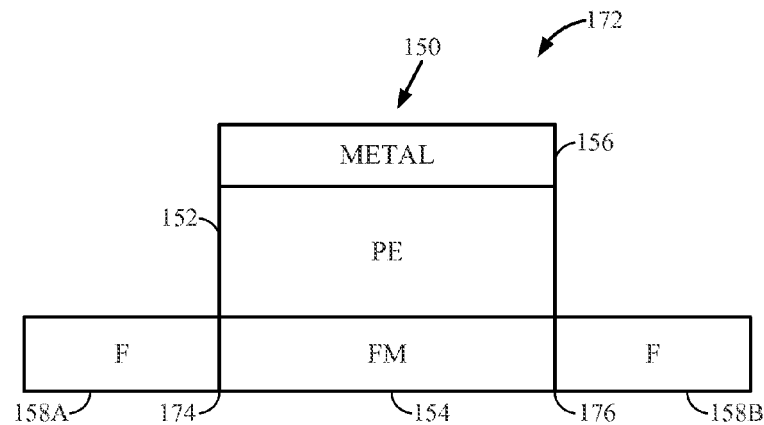
FIGS. 5A-5D are block diagrams of exemplary spin valve switches and spin transistors formed from a piezoelectric (PE) layer disposed between a first electrode and a ferromagnetic (FM) layer.

The voltage controlled spin channel 150 of FIGS. 3 and 4A-4C is readily incorporated into a voltage controlled spin valve switch or spin transistor as is more fully illustrated in FIGS. 5A-5D. In particular, FIG. 5A illustrates a spin valve switch 172 formed from a voltage controlled spin channel 150 coupled to a first fixed ferromagnetic layer 158A and a second fixed ferromagnetic layer 158B. The interface between the first fixed ferromagnetic layer 158A and the ferromagnetic layer 154 forms a magnetic junction 174 or spin valve, which has a potential analogous to a p-n junction in a diode, but instead of an electrical potential, it is a magnetic potential. Likewise, the interface between the second fixed ferromagnetic layer 158B and the ferromagnetic layer 154 forms a magnetic junction 176. For most materials, the magnetic junctions 174 and 176 are not efficient. Note that if the fixed ferromagnetic layer 158 is made of the same material as the ferromagnetic layer 154 there is no magnetic junction and form a domain wall therebetween if the piezoelectric dielectric layer 152 places a strain on the ferromagnetic layer 154. In an exemplary embodiment, the fixed ferromagnetic layers 158 are made from the same material. However, in an alternate embodiment, the fixed ferromagnetic layers 158 are made from different materials to create an asymmetric spin valve switch.

Figure 5B:
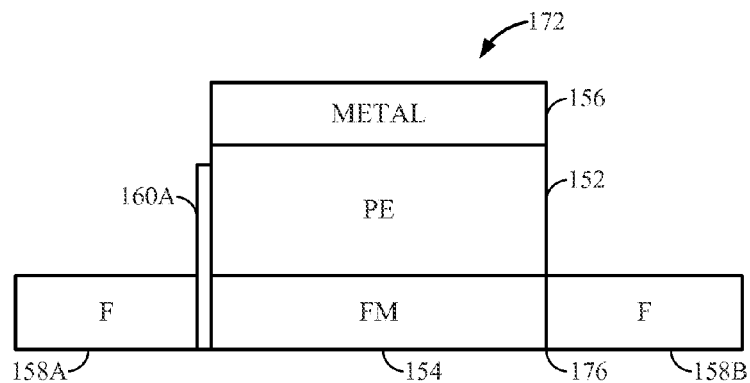
Figure 5C:
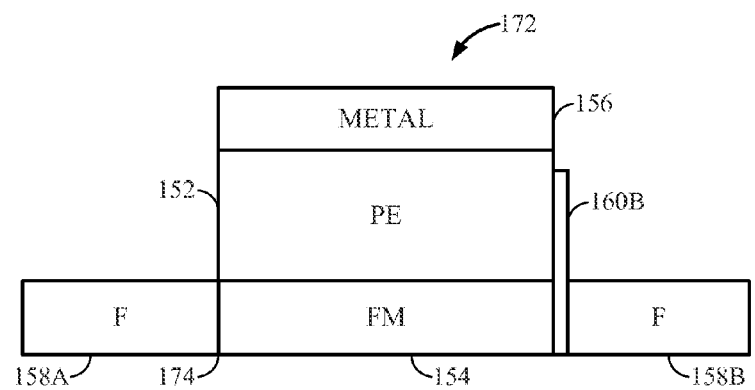

To improve spin injection efficiency at the magnetic junctions 174, 176, a tunnel barrier may be used. FIGS. 5B and 5C illustrate alternate embodiments using tunnel barriers 160A, 160B at magnetic junctions 174, 176 respectively. The tunnel barriers 160A, 160B improve spin polarized current injection and avoid conductivity mismatches between the ferromagnetic layers 154, 158A, and 158B. Such junction is also called a magnetic tunneling junction.

Figure 5D:
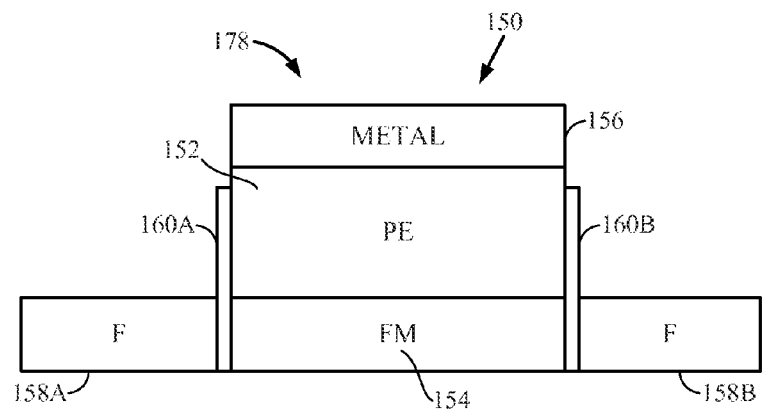

Accordingly, use of two tunnel barriers 160A, 160B at both magnetic junctions 174, 176 provides a spin transistor 178, as illustrated in FIG. 5D. More specifically, FIG. 5D shares the previously discussed piezoelectric dielectric layer 152, the ferromagnetic layer 154, and the metal layer 156. The first fixed ferromagnetic layer 158A on one side of the ferromagnetic layer 154 functions as a source for the spin transistor 178. The first fixed ferromagnetic layer 158A is separated from the ferromagnetic layer 154 by the tunnel barrier 160A. The second fixed ferromagnetic layer 158B on the other side of the ferromagnetic layer 154 is used as a drain for the spin transistor 178. The second fixed ferromagnetic layer 158B is separated from the ferromagnetic layer 154 by the second tunnel barrier 160B. In effect, the fixed ferromagnetic layers 158A and 158B form two MTJs with a shared channel formed by the ferromagnetic layer 154. The metal layer 156 acts as the electrode for the gate, and the ferromagnetic layers 158A, 158B provide the source and drain to which electrodes can be affixed. This structure allows the spin transistor 178 to function as a switch or as a memory element. In either case, the structure allows changes in state with less current than other designs, which, in turn saves power.

Figure 6:
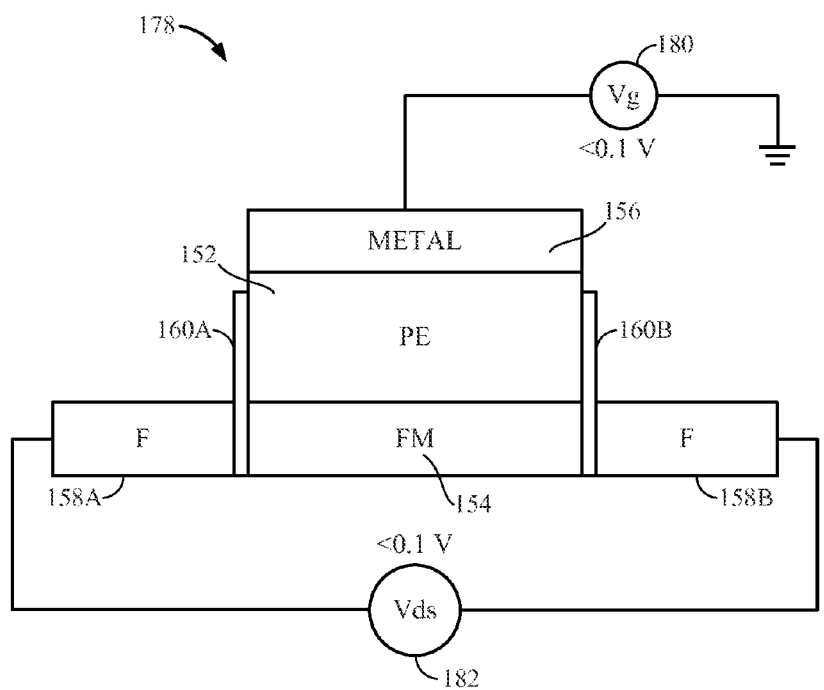
FIG. 6 is a diagram of the spin transistor of FIG. 5D, illustrating voltage bias leading to stress induced meta-stability by the PE layer.

FIG. 6 is a diagram of the spin transistor 178 of FIG. 5, illustrating the voltage applied to the piezoelectric dielectric layer 152 that induces meta-stable spin state in the ferromagnetic layer 154. Note that the voltage source 180 provides voltage Vg which is applied to the metal layer 156 and, in an exemplary embodiment, is less than 0.1 V. Likewise, voltage source 182 provides voltage Vds between the source and the drain of the spin transistor 178. Voltage Vds may likewise, in an exemplary embodiment, be less than 0.1 V.

Figure 7:
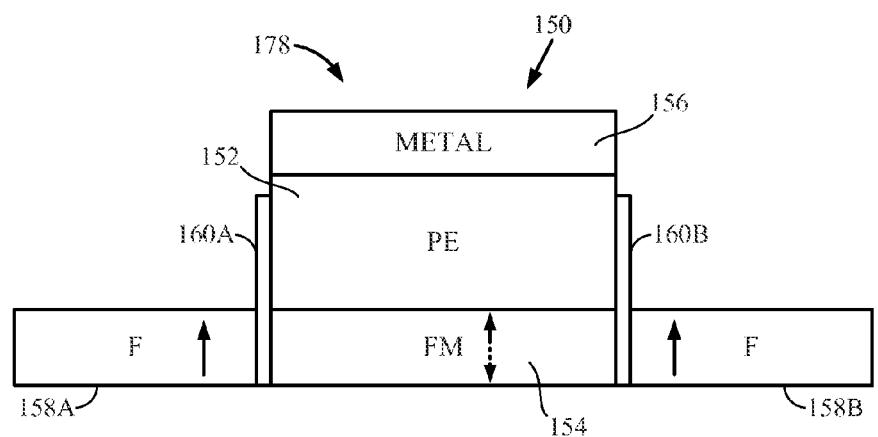
FIG. 7 is a diagram of the spin transistor of FIG. 5D, illustrating spin current induced polarization state changes assisted by the stress induced meta-stability of FIG. 6.

FIG. 7 illustrates the spin transistor 178 with a current applied to the source and drain of the spin transistor 178 such that the ferromagnetic layer 154 has transitioned from the metastable state to the ON state (solid arrow) or OFF state (dotted arrow). Again, the amount of current required to shift from the metastable state to either the ON or OFF states is very low and thus power conservation is effectuated.

The arrangement of the present disclosure provides a single domain ferromagnetic channel (high on/off ratio) with comparatively low power supply, on the order of <<0.1V Vgs and Vds voltage. By way of example, 50 mV has been demonstrated. Furthermore, the thickness of the piezoelectric dielectric layer 152 is relatively thick for strain translation, which results in a low capacitance associated therewith. Likewise, the channel state memory (ON and OFF) is switched by gate voltage pulse.

Figure 8:
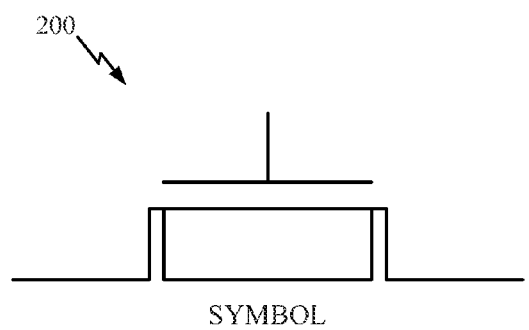
FIG. 8 is a proposed exemplary circuit diagram symbol for the exemplary spin transistor of FIG. 5D.

FIG. 8 is an exemplary circuit diagram symbol 200 for the exemplary spin transistor of FIG. 5D. Other symbols could be used, but the proposed symbol 200 is evocative of the structure of the present disclosure.

Figure 9:
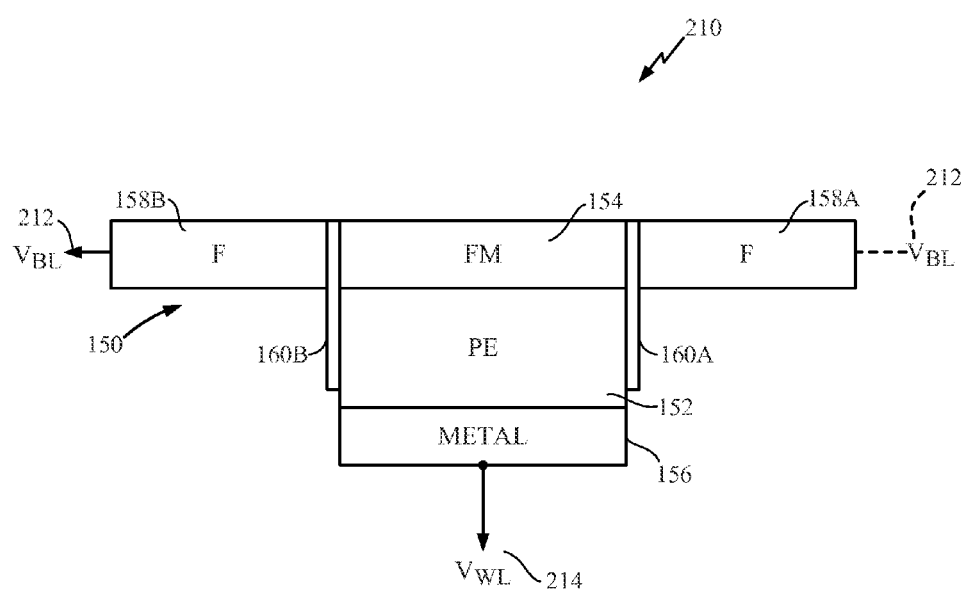
FIG. 9 is an exemplary memory device incorporating the spin transistor of FIG. 5D.

FIG. 9 illustrates an exemplary embodiment of the spin transistor 178 described above being used as a magnetic random access memory (MRAM). Specifically, FIG. 9 illustrates a first MRAM 210 that has a bit line 212 with a bit line voltage $V_{BL}$ coupled across the fixed ferromagnetic layers 158A, 158B. A word line 214 with a word line voltage $V_{WL}$ is coupled to the metal layer 156, which acts as a first electrode.

The spin transistor with memory according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
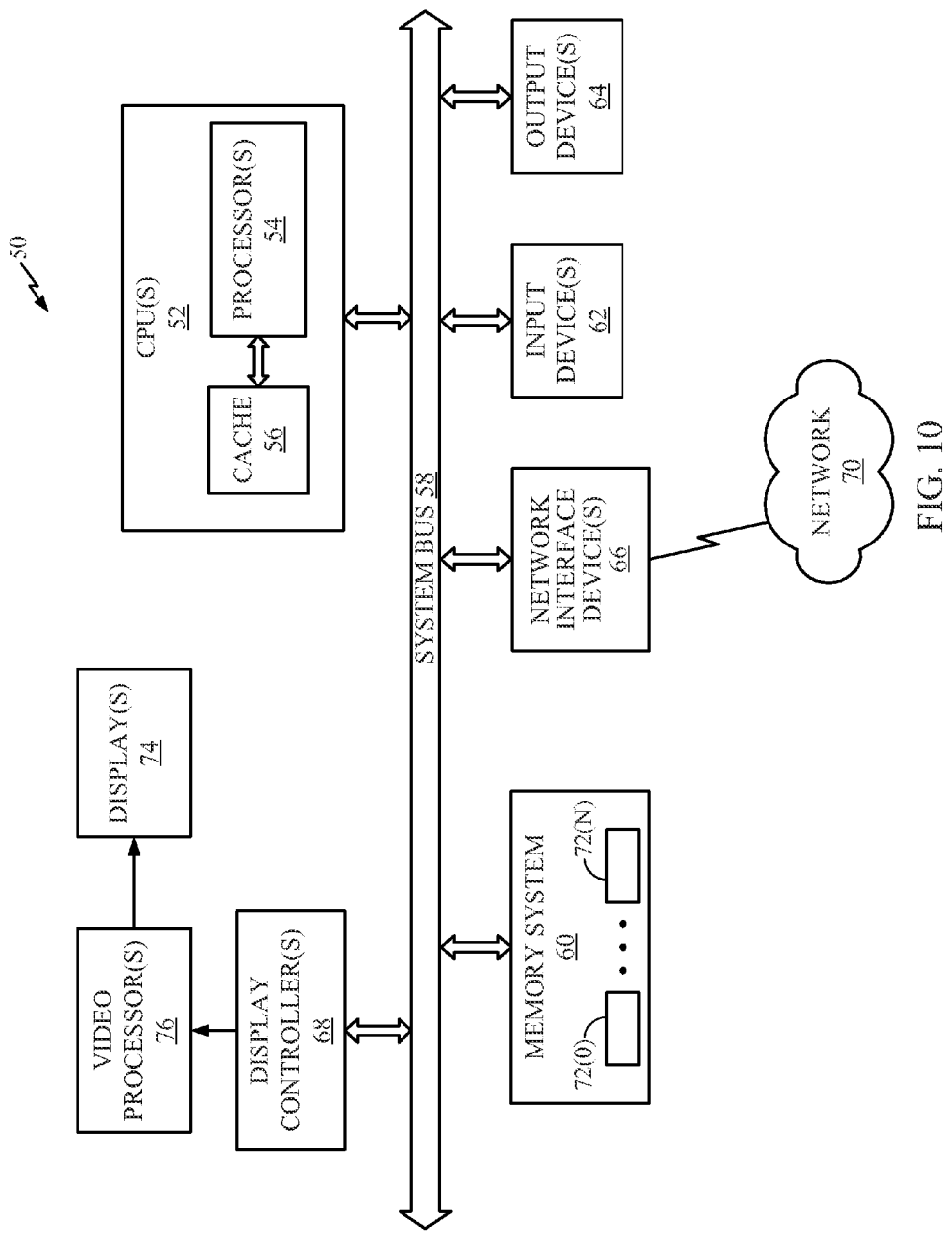
FIG. 10 is a block diagram of an exemplary processor-based system that can include the spin transistors disclosed herein.

In this regard, FIG. 10 illustrates an example of a processor-based system 50 that can employ the spin transistor 178 illustrated in FIG. 5D. In this example, the processor-based system 50 includes one or more central processing units (CPUs) 52, each including one or more processors 54. The CPUs 52 may be master devices. The CPUs 52 may have cache memory 56 coupled to the processor(s) 54 for rapid access to temporarily stored data. The CPUs 52 are coupled to a system bus 58 and can intercouple master devices and slave devices included in the processor-based system 50. As is well known, the CPUs 52 communicate with these other devices by exchanging address, control, and data information over the system bus 58. Although not illustrated in FIG. 10, multiple system buses 58 could be provided, wherein each system bus 58 constitutes a different fabric.

Other master and slave devices can be connected to the system bus 58. As illustrated in FIG. 10, these devices can include a memory system 60, one or more input devices 62, one or more output devices 64, one or more network interface devices 66, and one or more display controllers 68, as examples. The input device(s) 62 can include any type of input device, including but not limited to input keys, switches, voice processors, etc. The output device(s) 64 can include any type of output device, including but not limited to audio, video, other visual indicators, etc. The network interface device(s) 66 can be any devices configured to allow exchange of data to and from a network 70. The network 70 can be any type of network, including but not limited to a wired or wireless network, a private or public network, a local area network (LAN), a wide local area network (WLAN), and the Internet. The network interface device(s) 66 can be configured to support any type of communication protocol desired. The memory system 60 can include one or more memory units 72 (0–N), which may include one or more MRAM 210.

The CPUs 52 may also be configured to access the display controller(s) 68 over the system bus 58 to control information sent to one or more displays 74. The display controller(s) 68 sends information to the display(s) 74 to be displayed via one or more video processors 76, which process the information to be displayed into a format suitable for the display(s) 74. The display(s) 74 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A spin transistor, comprising:
    a first magnetic tunnel junction (MTJ) comprising a first ferromagnetic layer;
    a second MTJ comprising a second ferromagnetic layer; and
    a shared spin layer comprising:
        an electrode;
        a piezoelectric dielectric layer; and
        a ferromagnetic spin layer,
    wherein the ferromagnetic spin layer and the first ferromagnetic layer form a first magnetic junction;
    wherein the ferromagnetic spin layer and the second ferromagnetic layer form a second magnetic junction; and
    wherein the first MTJ forms a source for the spin transistor, the second MTJ forms a drain for the spin transistor and the electrode forms a gate for the spin transistor.

2. The spin transistor of claim 1 wherein a voltage applied to the electrode causes the piezoelectric dielectric layer to induce a strain in the ferromagnetic spin layer to induce a spin polarization of ferromagnetic material into a metastable polarization state.

3. The spin transistor of claim 1 incorporated into a memory device.

4. The spin transistor of claim 1 configured to function as a switch.

5. The spin transistor of claim 1 integrated into a semiconductor die.

6. The spin transistor of claim 1, further comprising a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the spin transistor is integrated.

7. A method of forming a spin transistor, comprising:
    providing a first magnetic tunnel junction (MTJ) comprising a first ferromagnetic layer;
    providing a second MTJ comprising a second ferromagnetic layer and a second channel; and
    providing a shared spin layer comprising:
        an electrode;
        a piezoelectric dielectric layer; and
        a ferromagnetic spin layer,
    wherein the ferromagnetic spin layer and the first ferromagnetic layer form a first magnetic junction;
    wherein the ferromagnetic spin layer and the second ferromagnetic layer form a second magnetic junction; and
    wherein the first MTJ forms a source tier the spin transistor, the second MTJ forms a drain for the spin transistor and the electrode forms a gate for the spin transistor.

8. The method of claim 7 further comprising applying a voltage to the electrode to cause the piezoelectric dielectric layer to induce a strain in the ferromagnetic spin layer to induce a spin polarization of ferromagnetic material into a metastable polarization state.

9. The method of claim 7, wherein the spin transistor is formed in a semiconductor die.

10. A spin valve switch comprising:
    a first electrode;
    a ferromagnetic layer configured to provide a channel region;
    a piezoelectric dielectric layer disposed between the first electrode and the ferromagnetic layer configured to provide a gate dielectric;
    a first fixed ferromagnetic layer forming a first magnetic junction with the ferromagnetic layer;
    a second fixed ferromagnetic layer forming a second magnetic junction with the ferromagnetic layer;
    a first tunnel barrier associated with the first magnetic junction; and
    a second tunnel barrier associated with the second magnetic junction, wherein the first electrode forms a gate for the spin valve switch, the first fixed ferromagnetic layer acts as a source and the second fixed ferromagnetic layer acts as a drain such that the spin valve switch operates as a spin transistor.

11. The spin valve switch of claim 10, wherein a voltage applied to the first electrode causes the piezoelectric dielectric layer to induce a strain in the ferromagnetic layer to induce a spin polarization of ferromagnetic material into a metastable polarization state.

12. The spin valve switch of claim 10 incorporated into a memory device.

13. The spin valve switch of claim 10 integrated into a semiconductor die.

14. The spin valve switch of claim 10, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PCA), a monitor, a computer monitor, a television, a tuner, a radio, a satellite radio, a music player, a digital music player, a portable music player, a digital video player, a video player, a digital video disc (DVD) player, and a portable digital video player, into which the spin valve switch is integrated.

* * * * *